United States Patent
Bhave et al.

(10) Patent No.: US 7,522,019 B2
(45) Date of Patent: Apr. 21, 2009

(54) INTERNAL ELECTROSTATIC TRANSDUCTION STRUCTURES FOR BULK-MODE MICROMECHANICAL RESONATORS

(75) Inventors: Sunil A. Bhave, Ithaca, NY (US); Roger T. Howe, Briones, CA (US)

(73) Assignee: The Regents of the University of California, Oakland, CA (US)

( * ) Notice: Subject to any disclaimer, the term of this patent is extended or adjusted under 35 U.S.C. 154(b) by 137 days.

(21) Appl. No.: 11/146,303

(22) Filed: Jun. 3, 2005

(65) Prior Publication Data

US 2006/0017523 A1    Jan. 26, 2006

Related U.S. Application Data

(60) Provisional application No. 60/577,261, filed on Jun. 4, 2004.

(51) Int. Cl.
*H03H 9/00* (2006.01)
*H03H 9/125* (2006.01)

(52) U.S. Cl. ................................. 333/187; 333/188
(58) Field of Classification Search ............... 33/186; 333/187, 188, 186
See application file for complete search history.

(56) References Cited

U.S. PATENT DOCUMENTS 6,774,729 B2 *   8/2004   Kaida et al. ................. 327/364
6,894,586 B2 *   5/2005   Bircumshaw et al. ........ 333/133
6,967,432 B2 *   11/2005  Mitani et al. ................. 310/358
7,023,065 B2 *   4/2006   Ayazi et al. ................. 257/414
7,098,757 B2 *   8/2006   Avazi et al. ................. 333/186

OTHER PUBLICATIONS

Pourkamali, Siavash et al.; "VHF Single Crystal Silicon Capacitive Elliptic Bulk-Mode Disk Resonators—Part II: Implementation and Characterization", 2004, *Journal of Microelectromechanical Systems*, vol. 13, No. 6, pp. 1054-1062.
Pourkamali, Siavash et al.; "High-Q single Crystal Silicon HARPSS Capacitive Beam Resonators with Self-Aligned Sub-100-nm Transduction Gaps", 2003, *Journal of Microelectromechanical Systems*, vol. 12, No. 4, pp. 487-496.

* cited by examiner

*Primary Examiner*—Dean O Takaoka
(74) *Attorney, Agent, or Firm*—Townsend and Townsend and Crew LLP

(57) ABSTRACT

An electrostatic transducer for micromechanical resonators, in which the electrode gaps are filled with a dielectric material having a much higher permittivity than air. This internal electrostatic transducer has several advantages over both air-gap electrostatic and piezoelectric transduction; including lower motional impedance, compatibility with advanced scaled CMOS device technology, and extended dynamic range. In one aspect, in order to minimize energy losses, the dielectric material has an acoustic velocity which is matched to that of the resonator material. Internal electrostatic transduction can be adapted to excite and detect either vertical modes (perpendicular to the substrate) or lateral modes (in the plane of the substrate). Its increased transduction efficiency is of particular importance for reducing the motional resistance of the latter.

30 Claims, 6 Drawing Sheets

$E$ = Young's modulus
$A$ = Cross-section area
$Q$ = Quality factor
$w$ = Resonant frequency
$L$ = Half wavelength
$g$ = Length of transducer element
$V_{DC}$ = Bias voltage
$\varepsilon_{TiO2} = \kappa_{TiO2} \cdot \varepsilon_0$ = Permittivity of $TiO_2$

INTERNAL ELECTROSTATIC TRANSDUCTION STRUCTURES FOR BULK-MODE MICROMECHANICAL RESONATORS

CROSS-REFERENCES TO RELATED APPLICATIONS

This application claims priority to U.S. Provisional Patent Application No. 60/577,261, filed Jun. 4, 2004, the disclosure of which is hereby incorporated by reference herein in its entirety for all purposes.

STATEMENT AS TO RIGHTS TO INVENTIONS MADE UNDER FEDERALLY SPONSORED RESEARCH OR DEVELOPMENT

This invention was made with Government support under Grant (Contract) No. N66001-01-1-8967 awarded by DARPA. The Government has certain rights to this invention.

BACKGROUND OF THE INVENTION

The present invention relates to micromechanical resonators. In particular, the present invention is related to internal electrostatic transduction structures for bulk-mode resonators.

Surface micromachining technology supports fabrication of multifrequency, electrostatically transduced bulk resonators on a single substrate. Using lithography, a single mask can include multi-frequency filters, oscillators and mixers if the microstructures are excited in lateral modes (i.e., modes within the plane of the substrate). Electrostatic excitation of microresonators has been problematic due the relatively large motional resistance of the device, which directly results from the low transduction efficiency compared with piezoelectric transduction (e.g., see, Humad et al, "High Frequency Micromechanical Piezo-on-Silicon Block Resonators," *IEDM*, 957-960 (2003)). For lateral bulk acoustic microresonators, the reduced transducer area further increases the motional resistance (e.g., see, Mattila et al., "Micromechanical Bulk Acoustic Wave Resonator," *Ultrasonics Symposium*, 945-948 (2002)). Several approaches to increasing transducer area include forming a coupled array of resonators (e.g., see, Demirci et al., "Mechanically Corner-Coupled Square Microresonator Array for Reduced Series Motional Resistance," *Transducers*, 955-958 (2003)) and large diameter bulk annular ring resonators (e.g., see, Li et al., "Micromechanical "Hollow-Disk" Ring Resonators," *MEMS*, 821-824 (2004)). However, to reach motional resistances on the order of 50 Ω, a coupled array of 100 resonators or a 400 μm diameter ring resonator would be needed. The signal routing challenges for these structures will be daunting at GHz frequencies and the chip area occupied by these resonator designs will be larger than for a Film Bulk Acoustic Resonator, or an FBAR, which has motional resistance of 2 Ω.

There is therefore a need for an improved electrostatic transducer with enhanced efficiency that does not suffer from the design disadvantages of either air-gap electrostatic or piezoelectric transducers.

BRIEF SUMMARY OF THE INVENTION

The present invention provides an electrostatic transducer for micromechanical resonators, in which the electrode gaps are filled with a dielectric material having a much higher permittivity than air. This internal electrostatic transducer has several advantages over both air-gap electrostatic and piezoelectric transduction; including lower motional impedance, compatibility with advanced scaled CMOS device technology, and extended dynamic range. In one aspect, in order to minimize energy losses, the dielectric material has an acoustic velocity which is matched to that of the resonator material. Internal electrostatic transduction can be adapted to excite and detect either vertical modes (perpendicular to the substrate) or lateral modes (in the plane of the substrate). Its increased transduction efficiency is of particular importance for reducing the motional resistance of the latter.

The embodiments of the present invention enable the achievement of increased transduction efficiency and lower motional resistance in a given bulk resonator structure. Since the electrostatic transducer gaps are filled with a solid material, it should be noted that the resonator body incorporates the adjacent electrodes. In addition, the embodiments of the present invention enable the design of more manufacturable bulk resonators, since the width of the electrode gaps can be increased significantly while maintaining the same motional resistance. Electrostatically transduced bulk resonators with conventional air- or vacuum-gaps must use such narrow electrode gaps that their lithographically-determined definition is very difficult, which makes them more difficult to fabricate than conventional surface-micromachined devices such as, for example, accelerometers.

In one embodiment the present invention provides a micromechanical resonator having a microresonator body fabricated on a substrate incorporating an internal electrostatic transducer located approximately at the maximum strain antinode of the microresonator. The electrostatic transducer includes a first electrode, a dielectric layer disposed adjacent to the first electrode, and a second electrode disposed adjacent to the dielectric layer, in which the bulk acoustic modes of the micromechanical resonator are transduced.

In one aspect, the internal electrostatic transducer is oriented in a direction that is substantially perpendicular to the plane of the substrate, so as to enable the excitation and detection of lateral acoustic modes in the microresonator body.

In another aspect, the internal electrostatic transducer is oriented in a direction that is substantially parallel to the plane of the substrate, so as to enable the excite and detect vertical acoustic modes in the microresonator body.

In one aspect, the internal electrostatic transducer is formed by depositing and patterning the electrodes and the dielectric layer.

In one aspect, the internal electrostatic transducer is made from a semiconducting crystal and a deposited dielectric layer.

In another aspect, the internal electrostatic transducer is made from crystalline silicon and a deposited dielectric layer.

In another aspect, the internal electrostatic transducer is made from silicon and a dielectric material with substantially equal acoustic velocity as the silicon.

In another aspect, the internal electrostatic transducer is made from silicon and a dielectric material and the dielectric material has a thickness approximately equal to a quarter acoustic wavelength.

In another aspect, the internal electrostatic transducer is made from silicon and a dielectric material which can be titanium dioxide, hafnium dioxide, silicon nitride, alumina or silicon dioxide.

In one aspect, the internal electrostatic transducer is made from a conducting material, such as polycrystalline silicon, polycrystalline silicon germanium, and polycrystalline silicon carbide, and a dielectric material.

In another aspect, the internal electrostatic transducer is one of an array of transducers.

In another aspect, the internal electrostatic transducer is made from silicon and a graded permittivity dielectric embedded in the gap between the resonator and electrodes, and is configured to excite the shear bulk vibration mode of the micromechanical resonator.

In another embodiment, the present invention is directed to a method of forming a lateral mode high frequency electrostatic transducer. The method includes forming a resonator structure having an array of electrodes, wherein the electrodes are separated from each other by electrode gaps, and filling the electrode gaps with a dielectric material having a permittivity value that is higher than the permittivity value of air.

In one aspect, the filling of the electrode gaps is accomplished using a low pressure chemical vapor deposition process.

In another aspect, the filling of the electrode gaps is accomplished using an atomic layer deposition process.

In one aspect, the dielectric material has an acoustic velocity that is substantially equal to that of the electrodes.

In another aspect, the dielectric material has a Young's modulus-to-density ratio that is substantially equal to that of the resonator structure.

In one aspect, the electrode gaps are filled with a dielectric material which can be titanium dioxide, hafnium dioxide, silicon nitride, alumina or silicon dioxide.

In another embodiment, the present invention is directed to a method of forming a lateral mode high frequency electrostatic transducer. The method includes forming a resonator having an array of electrodes, wherein the electrodes are separated from each other by electrode gaps, and filling the electrode gaps with a dielectric material having a permittivity value that is higher than the permittivity value of air, wherein the dielectric material can be titanium dioxide, hafnium dioxide, silicon nitride, alumina or silicon dioxide, and wherein the dielectric material has an acoustic velocity that is substantially equal to that of the electrodes.

In another embodiment, the present invention is directed to a micromechanical device fabricated by a method, that includes forming a resonator having an array of electrodes, wherein the electrodes are separated from each other by electrode gaps, and filling the electrode gaps with a dielectric material having a permittivity value that is higher than the permittivity value of air.

In one aspect, the filling of the electrode gaps employs a low pressure chemical vapor deposition process.

In another aspect, the filling of the electrode gaps employs an atomic layer deposition process.

In one aspect, the dielectric material has an acoustic velocity that is substantially equal to that of the resonator structure.

In another aspect, the dielectric material has Young's modulus-to-density ratio that is substantially equal to that of the resonator structure.

In one aspect, the dielectric material may be titanium dioxide, hafnium dioxide, silicon nitride, alumina or silicon dioxide.

In another embodiment, the present invention is directed to a micromechanical device fabricated by a method, including forming a resonator having an array of electrodes, wherein the electrodes are separated from each other by electrode gaps, and filling the electrode gaps with a dielectric material having a permittivity value that is higher than the permittivity value of air, wherein the dielectric material may be titanium dioxide, hafnium dioxide, silicon nitride, alumina or silicon dioxide, and wherein the dielectric material has an acoustic velocity that is substantially equal to that of the electrodes.

For a further understanding of the nature and advantages of the invention, reference should be made to the following description taken in conjunction with the accompanying drawings.

DETAILED DESCRIPTION OF THE INVENTION

Definitions

Figure 1:
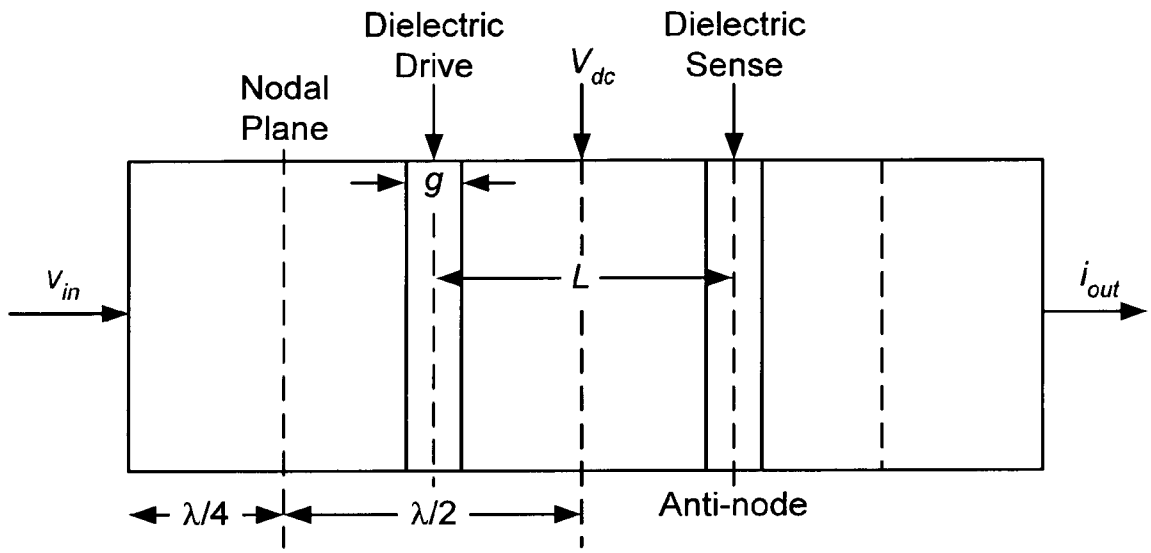
FIG. 1 is a schematic diagram of an electrostatically transduced $3^{rd}$ overtone bulk acoustic resonator, in accordance with the embodiments of the present invention.

Unless defined otherwise, all terms used herein have the meaning commonly understood by a person skilled in the art to which this invention pertains. The following terms have the meanings ascribed to them unless specified otherwise. "Resonator body" refers to the structure which contains the mechanical energy, which in the accordance with the embodiments of the present invention includes the associated electrodes and dielectric layers. The "electrodes" are the conducting structures used to apply electrical signals to the resonator body. The "internal electrostatic transduction structure" is the capacitor or capacitors formed by the conducting structures in the resonator, which are separated by the dielectric layer or layers.

The embodiments of the present invention provide an electrostatic transducer for micromechanical resonators, in which the electrode gaps are filled with a dielectric material having a higher permittivity than air. The embodiments of the present invention provide a new approach to electrostatic drive and detection of bulk acoustic micromechanical resonators in which the electrode-gaps are filled with a high dielectric constant material. Internal electrostatic transduction has much higher efficiency than air-gap electrostatic transduction for bulk-mode resonators, which results in improved electrical performance. An example of the effectiveness of the embodiments of the present invention is described where internal electrostatic transduction is demonstrated by the electrostatic actuation of a 1.9 GHz aluminum nitride (AlN) (κ~9) film bulk acoustic resonator (FBAR).

The electrostatic force and motional current for a parallel-plate electrostatic transducer are:

$$f = V_{DC} \cdot \frac{\varepsilon \cdot A}{g^2} \cdot v_{in}; \quad i = V_{DC} \cdot \frac{\varepsilon \cdot A}{g^2} \cdot \omega \cdot x$$

where:

$V_{DC}$ is the bias voltage, $\varepsilon$ is the permittivity of the dielectric material A is the transducer area.

g is the length of the transducer element, $\omega$ is the resonant frequency, and x is the electrode gap dimension.

Both terms are proportional to the permittivity $\varepsilon$ of the capacitor dielectric. In the electrostatic transducer in accordance with the embodiments of the present invention, the electrode gaps of the bulk acoustic resonators are filled with a dielectric material having much higher permittivity than vacuum or air ($\varepsilon_0$). Dielectric materials are characterized by their relative permittivity $\kappa = \varepsilon/\varepsilon_0$. Use of a high-$\kappa$ dielectric enhances both the force density of the electrostatic actuator as well as the sense capacitance, thereby reducing the motional resistance of these resonators by $\kappa^2$.

The fact that electrical fields inside an electrode/dielectric/electrode structure generate internal mechanical stresses is a result of electromechanical theory and was well known in the 1950's, if not earlier (e.g., see, *Electro-acoustics*, Wiley, N.Y., 1955). Early in the development of the MEMS field, it was demonstrated that audio-frequency cantilever beams can be driven and sensed using silicon nitride dielectric capacitors embedded in a silicon resonator (see, Bouwstra et al., "Excitation and Detection of Vibrations of Micromechanical Structures using a Dielectric Thin Film," *Sensors and Actuators*, 17:219-223 (1989)). Their resonator made use of Poisson's ratio to convert applied strain perpendicular to the beam's thickness into strain along the beam, which coupled into the fundamental bending mode. The dielectric transduction mechanism demonstrated by S. Bouwstra depends on Poisson coupling between the SiN and silicon to generate the bending moment that causes the silicon resonator to vibrate in the vertical direction. The approach was deemed inefficient because air-gap capacitive transduction provided a larger displacement, which was the preferred performance metric at that time. The internal electrostatic transducer in accordance with the embodiments of the present invention directly couple to the bulk acoustic mode of a micromechanical resonator. As a result, efficient coupling between the electrical and mechanical domains is achieved.

Bulk-mode resonators have significantly different design requirements compared to flexural resonators. These resonators have maximum displacements on the order of a few nanometers. In accordance with the embodiments of the present invention, the transduction efficiency of bulk resonators is enhanced by filling the air-gaps with a low Young's modulus, high-$\kappa$ dielectric material. Since the electrode is physically attached (through the dielectric layer) to the microresonator, the structural design of the micromechanical resonator is modified since the resonator body incorporates the electrodes. In addition, the placement of the dielectric layers is preferably at the planes of maximum strain rather than of maximum displacement, as for air-gap transducers. In addition, the anchoring of the resonator body (including the electrodes and the dielectric layers) to the substrate is also different from bulk-mode resonators with air or vacuum gaps. One embodiment of the present invention is directed to using a dielectric with a similar acoustic velocity as the microresonator structural material with the internal electrostatic transducer placed at the maximum strain anti-nodes rather than at the maximum displacement nodes. This approach minimizes bulk energy losses due to acoustic velocity mismatch and optimizes transduction efficiency of the resonator. Titanium dioxide ($TiO_2$) with a relative permittivity of approximately $\kappa \sim 80$ and a bulk acoustic velocity of 7900 m/s is one such attractive material for this purpose, in the case of silicon, polysilicon, poly-silicon-germanium microresonators.

In order to compare the performance of the internal electrostatic transducer with that of piezoelectric transduction, its performance is evaluated in a $3^{rd}$ overtone lateral bulk acoustic resonator. This class of resonators has been demonstrated with air-gap electrostatic transduction (e.g., see, Mattila et al., "Micromechanical Bulk Acoustic Wave Resonator," *Ultrasonics Symposium*, 945-948 (2002); Li et al., "Micromechanical "Hollow-Disk" Ring Resonators," *MEMS*, 821-824 (2004)) and piezoelectric transduction (e.g., see, Humad et al., "High Frequency Micromechanical Piezo-on-Silicon Block Resonators," *IEDM*, 957-960 (2003)). For purposes of illustration, the inventors herein have considered that the $3^{rd}$ overtone is excited and detected by introducing layers of $TiO_2$ at the two anti-nodal planes, as shown in FIG. 1. As shown in FIG. 1 and as used herein, E, or Y is the Young's modulus, A is the cross-sectional area, g is the length of transducer element, Q is the quality factor, $\omega$ is the resonant frequency, and L is the half wavelength.

The $d_{33}$ coefficient of zinc oxide (ZnO) is used to excite the lateral mode. The motional impedance of this resonator is $$R_{piezo} = \frac{g}{d_{33}^2 \cdot \omega \cdot Q \cdot A \cdot Y}$$

In accordance with the embodiments of the present invention, the piezoelectric layer is replaced with a high permittivity dielectric material, such as hafnium dioxide ($HfO_2$) ($\varepsilon = 30\varepsilon_0$) or $TiO_2$ ($\varepsilon = 80\varepsilon_0$). Signals and the DC bias voltage are applied to the resonator as shown in FIG. 1.

The motional impedance of this resonator is $$R_{electrostatic} = \frac{1}{\frac{(V_{dc}^2 \cdot \varepsilon_{dielectric}^2 \cdot A^2)}{g^4} \cdot \frac{\omega \cdot Q}{Y \cdot A/L}}$$

An assumption is that the silicon is accumulated due to the DC bias. To minimize the motional impedance, the maximum allowable electric field across the dielectric medium $E_{crit} = V_{dc}/g$ is applied. This simplifies the motional impedance to $$R_{electrostatic} = \frac{1}{\frac{(E_{crit}^2 \cdot \varepsilon_{dielectric}^2 \cdot A^2)}{g^4} \cdot \frac{\omega \cdot Q}{Y \cdot A/L}}$$

As the micromechanical resonator dimensions are scaled down and its resonance is moved up to microwave frequencies, the length of the resonator body will converge to the length of the transducer material, or $g \neq L$, and the motional impedance thereby reduces to $$R_{electrostatic} = \frac{1}{\frac{(E_{crit}^2 \cdot \varepsilon_{dielectric}^2 \cdot A)}{g} \cdot \frac{\omega \cdot Q}{Y}}$$

The ratio of the motional impedances of the two transduction schemes simplifies to $$\frac{R_{electrostatic}}{R_{piezo}} = \frac{d_{33}^2 \cdot Y^2}{\varepsilon_{dielectric}^2 \cdot E_{crit}^2}$$

Substituting the material properties for AlN as the piezoelectric transducer, the ratio is 100. In other words, when a material with permittivity 10 times higher than AlN is used to fill the electrode gaps, the electrostatic impedance will be equal to the piezoelectric impedance. $TiO_2$, with a relative permittivity of $\in_r=80$ and a Young's modulus-to-density ratio closely matched to that of silicon, is one such material. Note that the motional impedance of the internal electrostatic drive will be a factor of $\in_r^2=6,400$ lower than an air-gap electrostatic drive of equivalent dimensions. So, by replacing the electrode-gap at the nodes with $TiO_2$ at the antinodes, the motional resistance is reduced by $\kappa^2=6,400$.

A 14 MHz bulk acoustic resonator with 1 μm air-gap electrostatic transducers has a motional resistance of 590 kΩ (e.g., see, Mattila et al., "Micromechanical Bulk Acoustic Wave Resonator," *Ultrasonics Symposium*, 945-948. (2002)). The $3^{rd}$ harmonic of an identical resonator with $TiO_2$ dielectric transduction has a motional resistance of 275 Ω. Similarly, the motional resistance of the 1.2 GHz 3rd harmonic ring resonator (e.g., see, Li et al., "Micromechanical "Hollow-Disk" Ring Resonators," *MEMS*, 821-824 (2004)) scales down from 282 kΩ to 44 Ω, once modified in accordance with the embodiments of the present invention.

EXAMPLE

Electrostatic Excitation of an FBAR

Figure 2:
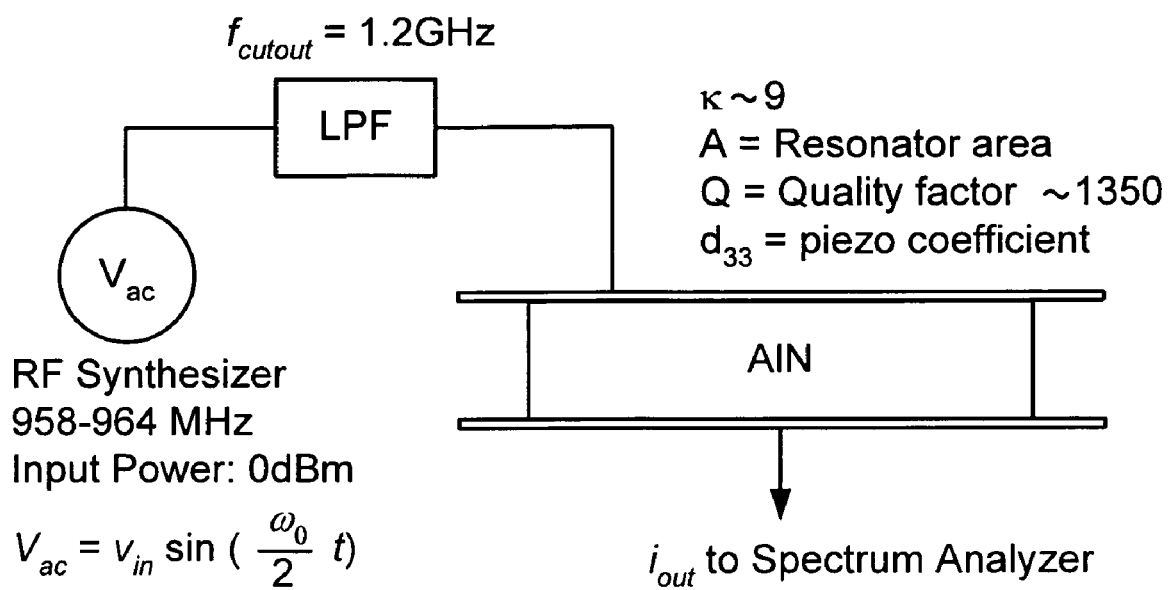
FIG. 2 is a schematic diagram of the test equipment setup for half-frequency measurements to demonstrate internal electrostatic transduction of an FBAR, in accordance with the embodiments of the present invention.

An Agilent Technologies' AlN FBAR (e.g., see, Ruby et al., "Ultra-Miniature High-Q Filters and Duplexers using FBAR Technology," *ISSCC*, 120-121 (2001)) was used to demonstrate internal electrostatic transduction. AlN has a relative permittivity of κ~9 and the resonator has a mechanical quality factor Q of approximately 1350 at a resonant frequency of $f_0=1.92$ GHz. FIG. 2 shows a schematic diagram of the test equipment setup for half-frequency measurements. Electrostatic force is quadratic; therefore the FBAR is actuated with an input signal at half the resonant frequency. This ensures that there is no piezoelectric actuation of the resonator. A low-pass-filter was added to prevent any harmonics from the RF synthesizer from reaching the input electrode. The Spectrum Analyzer was set to MAX_HOLD as the synthesizer frequency was swept near half-resonance frequency.

Electrostatic actuation generates stress in the resonator at the resonant frequency:

$$T_{electrostatic}(f_0) = \frac{1}{4} \cdot \kappa_{AlN} \cdot \varepsilon_0 \cdot \frac{v_{in}^2}{t^2}.$$

This electrostatic stress generates dielectric displacement and results in piezoelectric displacement current:

$$i_{out,piezo}(f_0) = \omega_0 \cdot A \cdot Q \cdot d_{33} \cdot \frac{1}{4} \cdot \kappa_{AlN} \cdot \varepsilon_0 \cdot \frac{v_{in}^2}{t^2}.$$

The output current also has an electrostatic component due to the quadratic electrostatic force. However, this component is small compared to the piezo component due to the relatively large resonator thickness.

Figure 3:
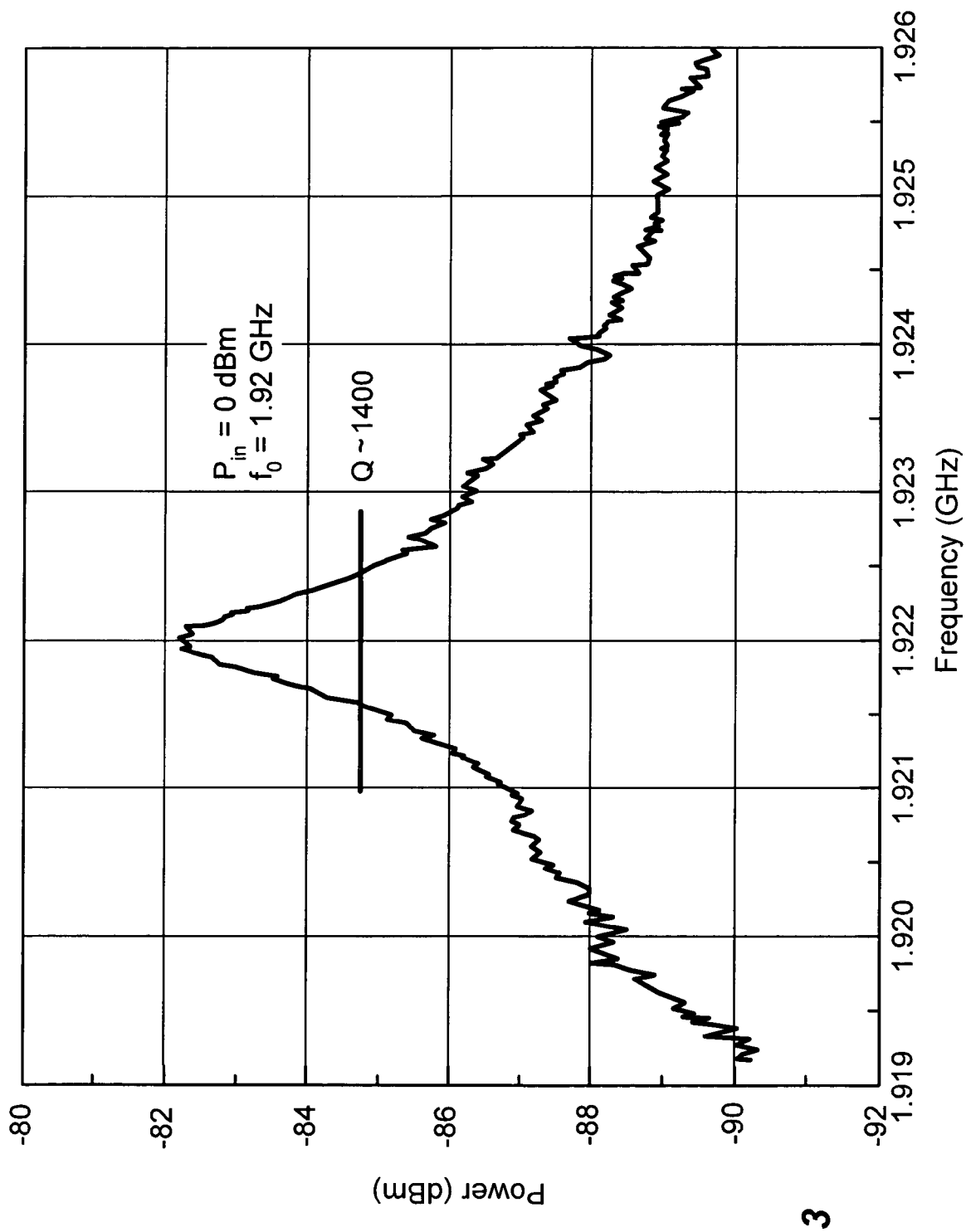
FIG. 3 is a graph of the FBAR transmission spectrum obtained using half-resonance electrostatic actuation. A Q value of approximately 1400 was extracted from the shape of the transfer function.

By sweeping the RF synthesizer frequency from 958 MHz to 964 MHz and using the MAX_HOLD function (e.g., see, Wang et al., "1.14-GHz Self-Aligned Vibrating Micromechanical Disk Resonator," *RFIC*, 335-338 (2003)) on the 8562EC Spectrum Analyzer, the mechanical transfer function of the FBAR was constructed, and is shown in FIG. 3. A Q value of approximately 1400 was extracted from the shape of the transfer function.

Figure 4:
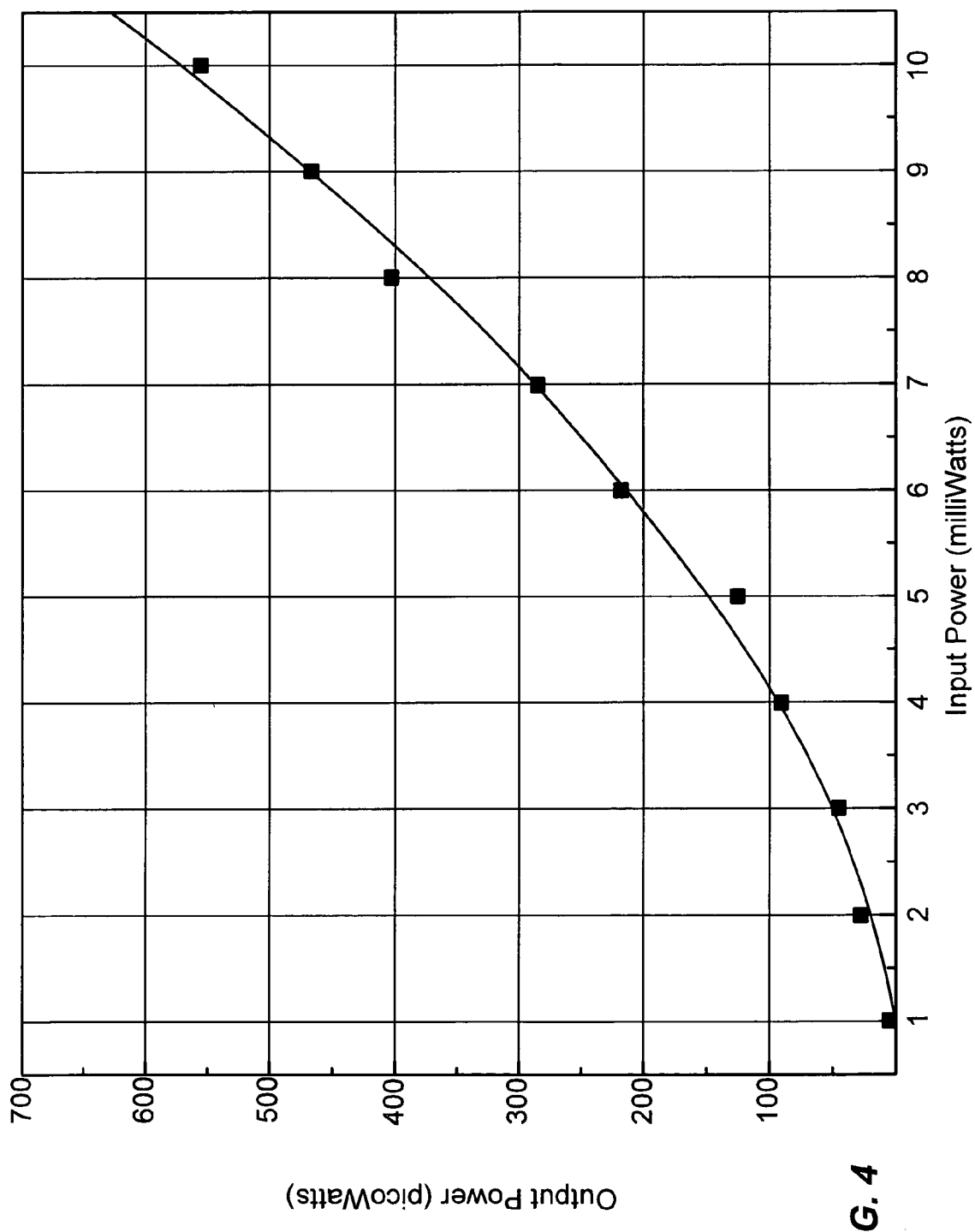
FIG. 4 is a graph of output vs. input power showing internal electrostatic actuation of the FBAR of FIG. 2. Output power is proportional to the square of the input power, verifying internal electrostatic actuation of the FBAR.

FIG. 4 is a graph of output vs. input power showing internal electrostatic actuation of the FBAR of FIG. 2. Output power is proportional to the square of the input power, verifying internal electrostatic actuation of the FBAR. While the output current is due to piezoelectric effect, the mechanical motion of the FBAR is due to electrostatic stress. Hence, both the mechanical motion and output power are proportional to square of the input power.

However, it should be noted that the FBAR is a one-port device and hence is not suitable for electrostatic transduction. However, the measurements summarized in FIGS. 3-4 for the excitation of an FBAR at 1.92 GHz with internal electrostatic actuation, provide an experimental verification of internal electrostatic drive for bulk-mode resonators.

In accordance with the embodiments of the present invention, internal electrostatic transducers using high-κ dielectrics achieve $\kappa^2$ higher efficiency than conventional air-gap transducers. This new approach enables the fabrication of arrays of small footprint lateral bulk acoustic resonators with motional resistances <1 kΩ. The embodiments of the present invention also enable the design of microwave frequency resonators with reasonable motional resistances.

Fabrication Technology

In one embodiment, the structure of FIG. 1 (i.e., bulk resonator with internal electrostatic transduction) is fabricated from a silicon-on-insulator layer and is suspended over the plane of the substrate by using surface micromachining. The processes and materials developed for advanced CMOS are suitable for several aspects of the microresonator described herein. The vertical-channel "FinFET" structures pioneered over the past few years by the UC Berkeley Device Research Group (e.g., see, X. Huang et al., "Sub-50 nm p-channel FinFET," *IEEE Trans. on Electron Devices*, 48:880-885 (2001)) are being pursued by many research groups in academia and industry. The substrate for the FinFET is a thin silicon-on-insulator layer. The device geometry is defined by e-beam lithography; more recently, spacer lithography has been developed to reduce the minimum feature size into the range of 10 nm.

Figure 5:
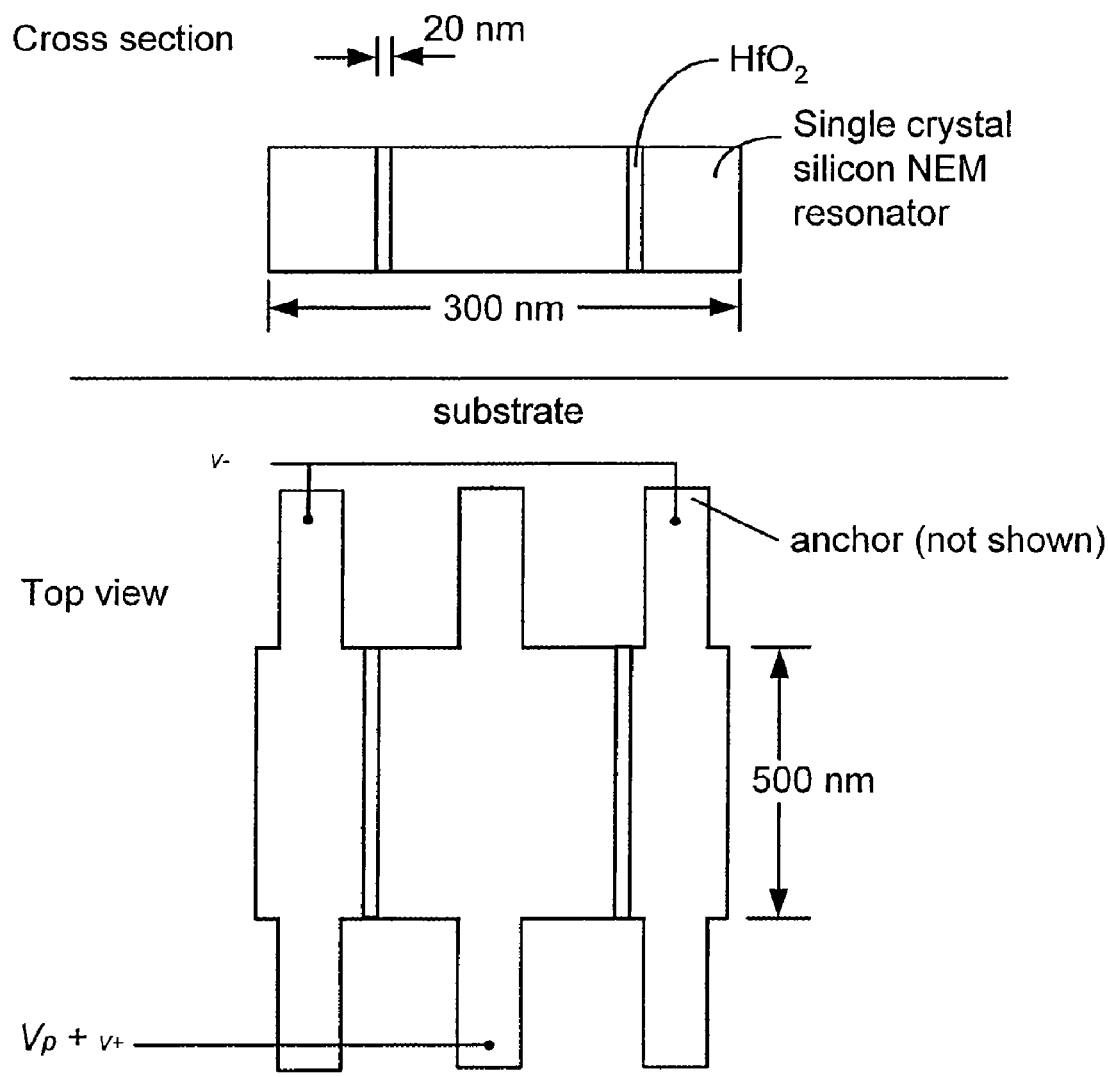
FIG. 5 is a schematic diagram of a 45 GHz bulk-mode resonator with internal drive.

Recent progress in the conformal deposition of ultra-thin, high-dielectric constant ceramic materials such as $HfO_2$ make feasible the new type of internal electrostatic transducer for excitation of lateral modes. FIG. 5 is a schematic cross section of a bulk lateral microresonator which incorporates a 10 nm-thick vertical insulating layer formed by spacer lithography and atomic layer deposition (ALD) to fill the gap with $HfO_2$ (e.g., see, Gordon et al., *Chemical Vapor Deposition*, 2003(9):73-78 (2003)). The relative permittivity of $HfO_2$ films is $\in_r\approx 35$ and acoustic measurements indicate that the Young's modulus is E≈170-225 GPa, which is reasonably well-matched to that of silicon. $TiO_2$ has an even higher relative permittivity of about 80 and is also well-matched acoustically to silicon; however, its deposition by low pressure chemical vapor deposition (LPCVD) or ALD has not been studied as extensively.

For simplicity, the $HfO_2$ is shown filling the electrode gaps in the cross section in FIG. 5. The ALD or LPCVD deposition process will coat all sidewalls with this film. The schematic suspension is designed to have minimum interaction with the bulk lateral mode. It should be noted that the third overtone is not the limit for an internal electrostatic transduction scheme. A long strip resonator consisting of repeated drive or sense units, which would operate at a very high overtone may also be fabricated using similar techniques. This structure further increases transduction efficiency and enables differential two-port resonators with small feed through.

Figure 6:
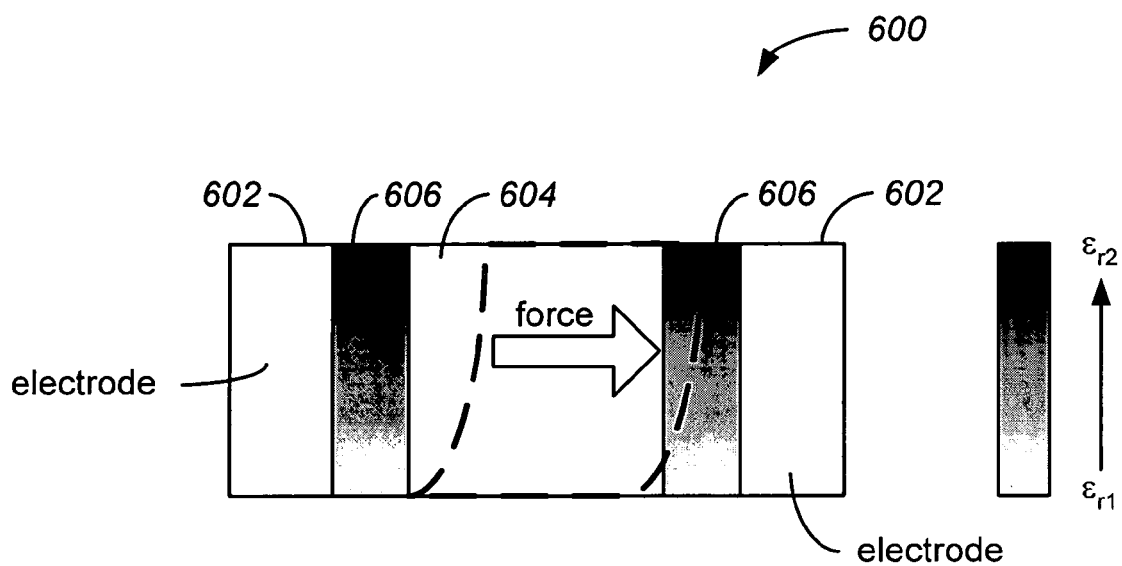
FIG. 6 is a schematic diagram of a graded permittivity dielectric layer embedded in the gap between the resonator and electrodes, in accordance with the embodiments of the present invention.

Set forth above, are the operation principle and the experimental verification of internal electrostatic transduction in accordance with the embodiments of the present invention. FIG. 6 is a schematic diagram 600 of a graded permittivity dielectric layer embedded in the gap between the resonator and electrodes, in accordance with the embodiments of the present invention. The device of FIG. 6 is configured for a shear-mode excitation. Shear-mode excitation is achieved by forming a multi-layer dielectric stack with a gradually varying (e.g., increasing or decreasing) permittivity. FIG. 6 shows electrodes 602 that are separated from a resonator core 604 by a dielectric filling the gap 606 between the resonator core 604 and the electrodes 602. By establishing a gradient in the permittivity of the dielectric gap 606 between the resonator 604 and the electrode 602 a gradient in the electrostatic force is established. The schematic diagram of FIG. 6 may be viewed as both a cross-sectional as well as a top-view diagram of a shear-mode resonator. Furthermore, in certain embodiments, the electrodes 602 are further isolated from the anchor using a "mesa" suspension which is common in the design of quartz resonators.

Internal electrostatic transduction in accordance with the embodiments of the present invention provides several advantages over existing techniques. For example, not only are dielectric materials such as $TiO_2$ or $HfO_2$ CMOS compatible and qualified, but they are also readily available in state-of-the-art CMOS foundries. As described above, these materials can also be deposited conformally using atomic layer deposition (e.g., see, Gordon et al, *Chemical Vapor Deposition*, 2003(9):73-78 (2003)), enabling lateral bulk resonators with narrow trenches filled with the transducing dielectric. As a comparison, to date, piezoelectric materials like ZnO or AlN have not been grown with high quality on the side-walls of trenches.

As set forth above, the $3^{rd}$ overtone is not the limit for this transduction scheme; a resonator may be fabricated as a long strip resonator running at a very high overtone. This structure further increases transduction efficiency and enables two-port resonators with small feed-through, as well as passive mixers, at RF frequencies. In addition, high electric fields are confined within the resonator, which eliminates the reliability concerns of exposed surfaces with high electric fields; because there is no air-gap, the fabrication yield of the resonators in accordance with the embodiments of the present invention is expected to be significantly higher than the air-gap resonators.

As will be understood by those skilled in the art, the present invention may be embodied in other specific forms without departing from the essential characteristics thereof. For example, the electrode gaps may be filled with any high dielectric constant material using any suitable deposition techniques or the thin films may be layered on the substrate, as is done to fabricate the FBAR, which will enable the transduction of vertical modes. Alternatively, the electrodes can be arranged to transducer a vertical or lateral shear mode in the micromechanical resonator. These other embodiments are intended to be included within the scope of the present invention, which is set forth in the following claims.

What is claimed is:

1. A micromechanical electrostatic resonator comprising:
    a microresonator body fabricated on a substrate incorporating
    an internal electrostatic transducer located approximately at the maximum strain antinode of said microresonator, said electrostatic transducer comprising:
    a first electrode;
    a second electrode disposed opposite from said first electrode;
    a resonator core disposed between the electrodes and configured to connect with a DC bias voltage source; and
    a non-air non-piezoelectric dielectric layer disposed in contact with one of said electrodes and in contact with the resonator core,
    wherein the bulk acoustic modes of said micromechanical resonator are transduced in the resonator core.

2. The micromechanical resonator of claim 1 wherein said internal electrostatic transducer is oriented in a direction that is substantially perpendicular to the plane of said substrate, so as to enable the excitation and detection of lateral acoustic modes in the microresonator body.

3. The micromechanical resonator of claim 1 wherein said internal electrostatic transducer is oriented in a direction that is substantially parallel to the plane of said substrate, so as to enable the excite and detect vertical acoustic modes in the microresonator body.

4. The micromechanical resonator of claim 3 wherein said internal electrostatic transducer is formed by depositing and patterning said electrodes and said dielectric layer.

5. The micromechanical resonator of claim 1 wherein said internal electrostatic transducer is made from a semiconducting crystal and a deposited dielectric layer.

6. The micromechanical resonator of claim 1 wherein said internal electrostatic transducer is made from crystalline silicon and a deposited dielectric layer.

7. The micromechanical resonator of claim 1 wherein said internal electrostatic transducer is made from silicon and a dielectric material with substantially equal acoustic velocity as the silicon.

8. The micromechanical resonator of claim 1 wherein said internal electrostatic transducer is made from silicon and a dielectric material and the dielectric material has a thickness approximately equal to a quarter acoustic wavelength.

9. The micromechanical resonator of claim 1 wherein said internal electrostatic transducer is made from silicon and a dielectric material selected from a group consisting of titanium dioxide, hafnium dioxide, silicon nitride, alumina and silicon dioxide.

10. The micromechanical resonator of claim 1 wherein said internal electrostatic transducer is made from
    a conducting material selected from the group consisting of polycrystalline silicon, polycrystalline silicon germanium, and polycrystalline silicon carbide,
    and a dielectric material.

11. The micromechanical resonator of claim 1 wherein said internal electrostatic transducer is one of an array of transducers.

12. The micromechanical resonator of claim 1 wherein said internal electrostatic transducer is made from silicon and a graded permittivity dielectric embedded in the gap between the resonator and electrodes, configured to excite the shear bulk vibration mode of the micromechanical resonator.

13. A method of forming a lateral mode high frequency electrostatic transducer, comprising:
    forming a resonator structure having an array of electrodes and a resonator core, wherein the electrodes are separated from the resonator core by electrode gaps and the resonator core is configured to connect with a DC bias voltage; and
    filling the gaps between each electrode and the resonator core with a non-piezoelectric dielectric material disposed in contact with one of the electrodes and in contact with the resonator core, said non-piezoelectric dielectric material having a permittivity value that is higher than the permittivity value of air.

14. The method of claim 13 wherein said filling comprises a low pressure chemical vapor deposition process.

15. The method of claim 13 wherein said filling comprises an atomic layer deposition process.

16. The method of claim 13 wherein the dielectric material has an acoustic velocity that is substantially equal to that of the electrodes.

17. The method of claim 13 wherein the dielectric material has a Young's modulus-to-density ratio that is substantially equal to that of the resonator structure.

18. The method of claim 13 wherein the dielectric material is selected from a group consisting of titanium dioxide, hafnium dioxide, silicon nitride, alumina and silicon dioxide.

19. A method of forming a lateral mode high frequency electrostatic transducer, comprising:
    forming a resonator having an array of electrodes and a resonator core, wherein the electrodes are separated from the resonator core by electrode gaps and the resonator core is configured to connect with a DC bias voltage; and
    filling the gaps between each electrode and the resonator core with a non-piezoelectric dielectric material disposed in contact with one of the electrodes and in contact with the resonator core, said non-piezoelectric dielectric material having a permittivity value that is higher than the permittivity value of air, wherein the dielectric material is selected from the group consisting of titanium dioxide, hafnium dioxide, silicon nitride, alumina and silicon dioxide,
    and wherein the non-piezoelectric dielectric material has an acoustic velocity that is substantially equal to that of the electrodes.

20. A micromechanical electro-static device fabricated by a method, comprising:
    forming a resonator having an array of electrodes and a resonator core, wherein the electrodes are separated from the resonator core by electrode gaps and the resonator core is configured to connect with a DC bias voltage; and
    filling the gaps between each electrode and the resonator core with a non-piezoelectric dielectric material disposed in contact with one of the electrodes and in contact with the resonator core, said non-piezoelectric dielectric material having a permittivity value that is higher than the permittivity value of air.

21. The device of claim 20 wherein said filling comprises a low pressure chemical vapor deposition process.

22. The device of claim 20 wherein said filling comprises an atomic layer deposition process.

23. The device of claim 20 wherein the dielectric material has an acoustic velocity that is substantially equal to that of the resonator structure.

24. The device of claim 20 wherein the dielectric material has Young's modulus-to-density ratio that is substantially equal to that of the resonator structure.

25. The device of claim 20 wherein the dielectric material is selected from the group consisting of titanium dioxide, hafnium dioxide, silicon nitride, alumina and silicon dioxide.

26. A micromechanical electro-static device fabricated by a method, comprising:
    forming a resonator having an array of electrodes and a resonator core, wherein the electrodes are separated from the resonator core by electrode gaps and the resonator core is configured to connect with a DC bias voltage; and
    filling the gaps between each electrode and the resonator core with a non-piezoelectric dielectric material disposed in contact with one of the electrodes and in contact with the resonator core, said non-piezoelectric dielectric material having a permittivity value that is higher than the permittivity value of air, wherein the non-piezoelectric dielectric material is selected from the group consisting of titanium dioxide, hafnium dioxide, silicon nitride, alumina and silicon dioxide,
    and wherein the non-piezoelectric dielectric material has an acoustic velocity that is substantially equal to that of the electrodes.

27. The micromechanical resonator of claim 1, further comprising a DC bias voltage source connected with said resonator core.

28. The micromechanical resonator of claim 27, further comprising an AC signal voltage source connected with said electrodes.

29. The micromechanical resonator of claim 1, wherein a single layer of said non-air non-piezoelectric dielectric layer is disposed between each of said electrodes and the resonator core.

30. The micromechanical resonator of claim 1 wherein the dielectric layer has a graded permittivity, so as to establish a gradient in electrostatic force between the resonator core and the electrodes when the micromechanical resonator is energized.

* * * * *